United States Patent
Alhussien et al.

(10) Patent No.: US 9,184,954 B1
(45) Date of Patent: Nov. 10, 2015

(54) SYSTEMS AND METHODS FOR DIRECTED SOFT DATA PERTURBATION IN LAYERED DECODING

(71) Applicant: Seagate Technology LLC, Cupertino, CA (US)

(72) Inventors: Abdel Hakim S. Alhussien, San Jose, CA (US); Ludovik Danjean, San Jose, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/322,376

(22) Filed: Jul. 2, 2014

(51) Int. Cl.
*G11B 5/035* (2006.01)
*G11B 5/02* (2006.01)
*H04L 25/06* (2006.01)
*H04L 27/22* (2006.01)

(52) U.S. Cl.
CPC .............. *H04L 25/067* (2013.01); *H04L 27/22* (2013.01)

(58) Field of Classification Search
CPC .... G11B 20/10009; G11B 5/035; G11B 5/09; G11B 5/012; G11B 5/00; G11B 5/02; G11B 5/59655; G11B 27/36
USPC .................. 360/29, 31, 32, 39, 40, 55, 65, 53
See application file for complete search history.

(56) References Cited

U.S. PATENT DOCUMENTS

| | | | |
|---|---|---|---|
| 5,222,069 A | 6/1993 | Chevalley | |
| 5,731,922 A | 3/1998 | Yamasaki | |
| 5,938,790 A | 8/1999 | Marrow | |
| 6,029,264 A | 2/2000 | Kobayashi | |
| 6,272,659 B1 | 8/2001 | Zook | |
| 6,438,724 B1 | 8/2002 | Cox | |
| 6,446,234 B1 | 9/2002 | Cox | |
| 6,493,846 B1 | 12/2002 | Kondo | |
| 6,694,477 B1 | 2/2004 | Lee | |
| 6,810,094 B1 | 10/2004 | Lu | |
| 6,847,601 B2 | 1/2005 | Kanai | |
| 7,178,086 B2 | 2/2007 | Hassner | |
| 7,395,491 B2 | 7/2008 | Chen | |
| 7,685,497 B2 | 3/2010 | Kons | |
| 8,230,292 B2 | 7/2012 | Fujiwara | |
| 8,751,912 B1 * | 6/2014 | Varnica et al. | 714/785 |
| 2005/0166132 A1 | 7/2005 | Shen et al. | |
| 2007/0201632 A1 | 8/2007 | Ionescu | |
| 2010/0042890 A1 | 2/2010 | Gunnam et al. | |
| 2010/0287436 A1 | 11/2010 | Lastras-Montano | |
| 2011/0109773 A1 | 5/2011 | Dekel | |

(Continued)

FOREIGN PATENT DOCUMENTS

JP 06046406 2/1994

OTHER PUBLICATIONS

Kang et al., "A Two-Stage Iterative Decoding of LDPC Codes for Lowering Error Floors", IEEE GLOBECOM Proceedings, 1088-1091 (2008).

(Continued)

*Primary Examiner* — Nabil Hindi

(74) *Attorney, Agent, or Firm* — Cesari & Reed LLP; Kirk A. Cesari

(57) ABSTRACT

Systems and method relating generally to data processing, and more particularly to systems and methods for perturbing soft data in a layered decoder system.

20 Claims, 7 Drawing Sheets

(56) References Cited

U.S. PATENT DOCUMENTS

| | | |
|---|---|---|
| 2011/0161774 A1 | 6/2011 | Shin et al. |
| 2011/0164745 A1 | 7/2011 | Marzetta et al. |
| 2012/0005551 A1 | 1/2012 | Gunnam et al. |
| 2012/0288003 A1 | 11/2012 | Do et al. |
| 2013/0007570 A1 | 1/2013 | Seago |
| 2013/0024163 A1 | 1/2013 | Xia |
| 2013/0086446 A1 | 4/2013 | Yeung et al. |

OTHER PUBLICATIONS

Lin et al "An efficient VLSI Architecture for non binary LDPC decoders"—IEEE Transaction on Circuits and Systems II vol. 57, Issue 1 (Jan. 2010) pp. 51-55.

Perisa et al "Frequency Offset Estimation Based on Phase Offsets Between Sample Correlations" Dept. of Info. Tech. University of Ulm 2005.

U.S. Appl. No. 14/177,496, Unpublished (filed Feb. 11, 2014) (YuQing Yang).

U.S. Appl. No. 14/082,261, Unpublished (filed Nov. 18, 2013) (Shaohua Yang).

U.S. Appl. No. 14/025,356, Unpublished (filed Sep. 12, 2013) (Nayak Ratnakar Aravind).

U.S. Appl. No. 14/025,468, Unpublished (filed Sep. 12, 2013) (Shaohua Yang).

U.S. Appl. No. 13/654,417, Unpublished (filed Oct. 18, 2012) (Fan Zhang).

U.S. Appl. No. 13/766,857, Unpublished (filed Feb. 14, 2013) (Shaohua Yang).

U.S. Appl. No. 13/707,898, Unpublished (filed Dec. 7, 2012) (Razmik Karabed).

U.S. Appl. No. 13/426,722, Unpublished (filed Mar. 22, 2012) (Fan Zhang).

U.S. Appl. No. 13/452,733, Unpublished (filed Apr. 20, 2012) (Shaohua Yang).

U.S. Appl. No. 13/450,289, Unpublished (filed Apr. 18, 2012) (Shaohua Yang).

U.S. Appl. No. 13/284,754, Unpublished (filed Oct. 28, 2011) (Fan Zhang).

U.S. Appl. No. 13/363,751, Unpublished (filed Feb. 1, 2012) (Lei Chen).

\* cited by examiner

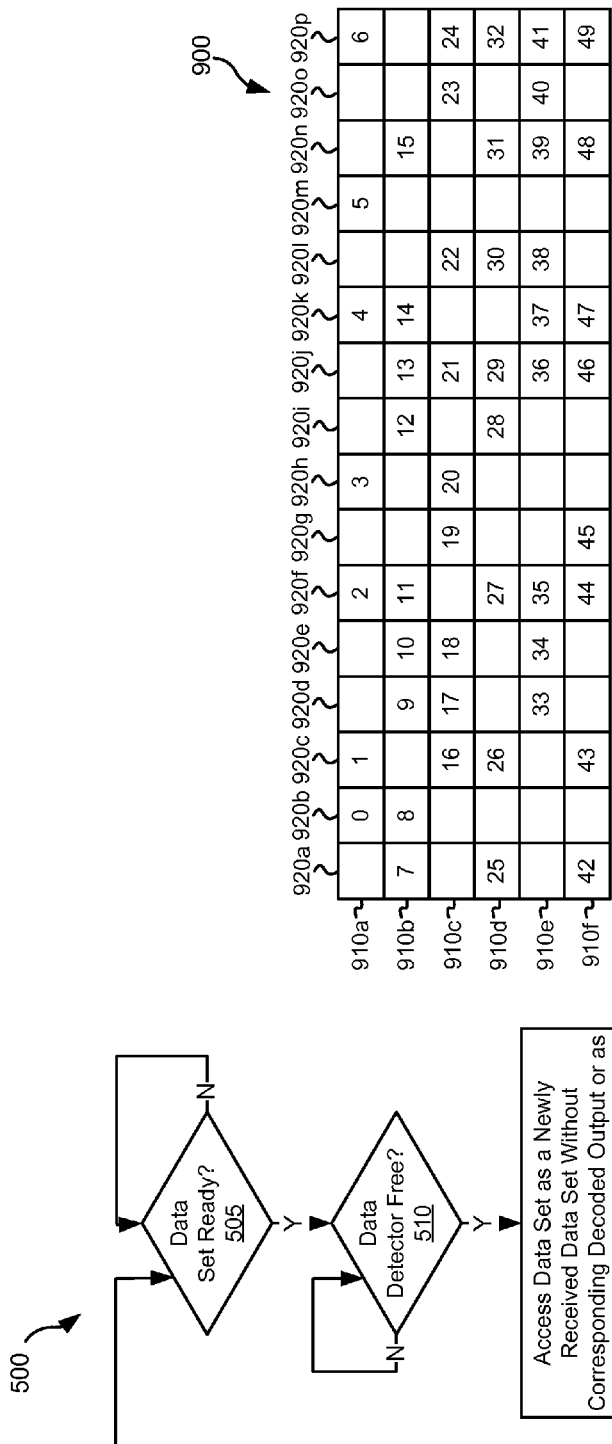

SYSTEMS AND METHODS FOR DIRECTED SOFT DATA PERTURBATION IN LAYERED DECODING

FIELD OF THE INVENTION

Systems and method relating generally to data processing, and more particularly to systems and methods for perturbing soft data in a layered decoder system.

BACKGROUND

Data transfer devices typically include data encoding and decoding circuitry to aid in the process of transferring and recovering data. In some cases, the encoding and decoding do not result in recovering the original data set. Hence, for at least the aforementioned reasons, there exists a need in the art for advanced systems and methods for data processing.

SUMMARY

Systems and method relating generally to data processing, and more particularly to systems and methods for perturbing soft data in a layered decoder system.

Some embodiments provide data processing systems that include a layered decoder circuit and a data perturbation circuit. The layered decoder circuit is operable to apply a data decode algorithm to a first layer of a decoder input to yield a first set of hard decision data and a first syndrome, and to a second layer of a decoder input to yield a second set of hard decision data and a second syndrome. The data perturbation circuit is operable to maintain a list of continuous layers exhibiting a zero value syndrome. The list of continuous layers exhibiting a zero value syndrome includes hard decision data for each layer in the list.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 5A-5B are flow diagrams showing a method for data processing in accordance with some embodiments of the present invention;

FIG. 9 graphically represents an example parity check matrix including rows that are processed as layers, and columns that are used to compare with other layers.

DETAILED DESCRIPTION OF SOME EMBODIMENTS

Figure 1:
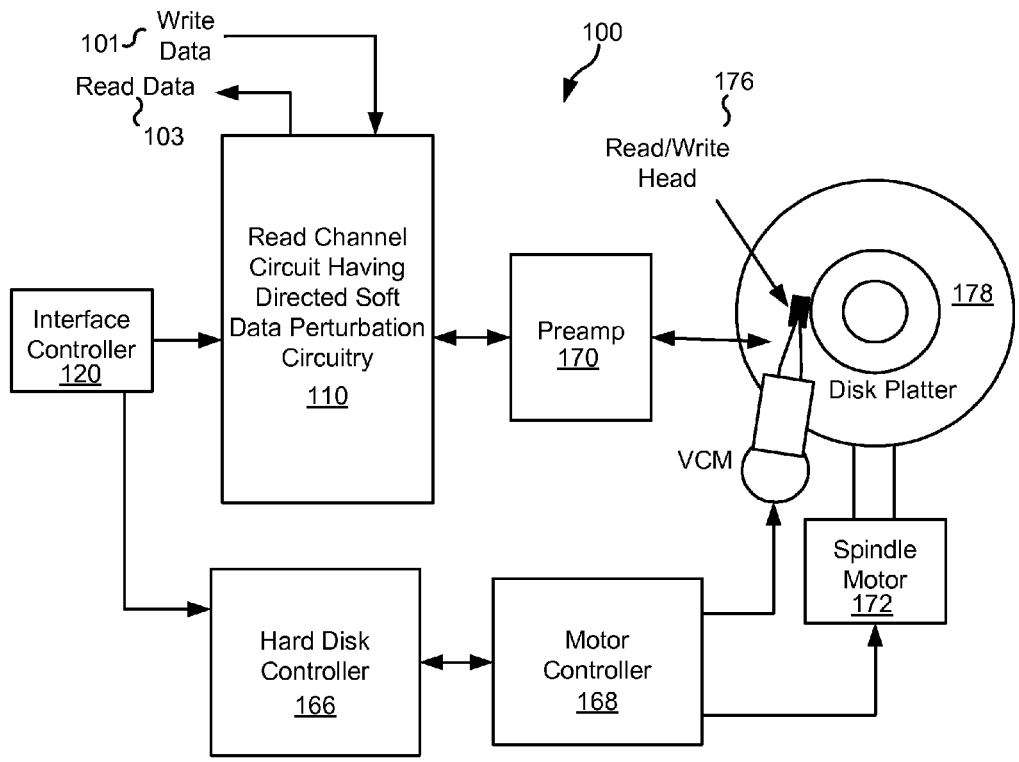
FIG. 1 shows a storage device including a read channel circuit having directed soft data perturbation circuitry in accordance with various embodiments of the present invention.

Systems and method relating generally to data processing, and more particularly to systems and methods for perturbing soft data in a layered decoder system.

Various embodiments of the present invention relies on a continuous zero syndrome running list (hereinafter the "CZS List" or "list of continuous layers exhibiting a zero value syndrome"). Some embodiments provide data processing systems that include a layered decoder circuit and a data perturbation circuit. The layered decoder circuit is operable to apply a data decode algorithm to a first layer of a decoder input to yield a first set of hard decision data and a first syndrome, and to a second layer of a decoder input to yield a second set of hard decision data and a second syndrome. The data perturbation circuit is operable to maintain a list of continuous layers exhibiting a zero value syndrome. The list of continuous layers exhibiting a zero value syndrome includes hard decision data for each layer in the list. In some cases, the data decode algorithm is a low density parity check algorithm. In various cases, the system is implemented as part of a communication device. In other cases, the system is implemented as a storage device. In one or more cases, the system is implemented as part of an integrated circuit.

In some instances of the aforementioned embodiments, the data perturbation circuit is further operable to empty the list of continuous layers exhibiting a zero value syndrome when the second syndrome is non-zero. In various instances, the data perturbation circuit is further operable to: determine that the second syndrome is non-zero; and perform at least one decision flip in the second set of hard decision data to yield a zero value for the second syndrome and an updated set of hard decision data. In some such instances, the data perturbation circuit is further operable to augment the list of continuous layers exhibiting a zero value syndrome to include the updated set of hard decision data. In one or more instances of the aforementioned embodiments, the data perturbation circuit is further operable to augment the list of continuous layers exhibiting a zero value syndrome to include the second set of hard decision data when the second syndrome is non-zero.

In various instances of the aforementioned embodiments where the list of continuous layers exhibiting a zero value includes the first set of hard decision data, the data perturbation circuit is further operable to compare the second set of hard decision data with corresponding elements in the first set of hard decision data to yield a set of conflicts, wherein the set of conflicts indicates locations where the second set of hard decision data does not agree with a corresponding element in the first set of hard decision data. In some cases, the data perturbation circuit is further operable to dampen a soft decision corresponding to an element of the second hard decision data at a location in the set of conflicts. In some cases, the data perturbation circuit includes a multiplier circuit, and wherein dampening the soft decision corresponding to the element of the second hard decision data at the location in the set of conflicts includes multiplying the soft decision by a scalar value. In one particular case, the scalar value is user programmable. In another particular case, the scalar value varies as a function of the number of layers represented in the list of continuous layers exhibiting a zero value syndrome.

Other embodiments of the present invention provide methods for data processing that include: applying a data decode algorithm by a data decoder circuit to a first layer of a decoder input to yield a first set of hard decision data and a first syndrome, and to a second layer of a decoder input to yield a second set of hard decision data and a second syndrome; and maintaining a list of continuous layers exhibiting a zero value syndrome. The list of continuous layers exhibiting a zero value syndrome includes at least the first set of hard decision data.

In some instances of the aforementioned embodiments, the methods further includes emptying the list of continuous layers exhibiting a zero value syndrome when the second syndrome is non-zero. In one or more instances of the aforementioned embodiments the methods further include augmenting the list of continuous layers exhibiting a zero value syndrome to include the second set of hard decision data when the second syndrome is non-zero. In various instances of the aforementioned embodiments, the methods further include: determining that the second syndrome is non-zero; and performing at least one decision flip in the second set of hard decision data to yield a zero value for the second syndrome and an updated set of hard decision data.

In various instances of the aforementioned embodiments where the list of continuous layers exhibiting a zero value includes the first set of hard decision data, the methods further include comparing the second set of hard decision data with corresponding elements in the first set of hard decision data to yield a set of conflicts, wherein the set of conflicts indicates locations where the second set of hard decision data does not agree with a corresponding element in the first set of hard decision data. In some such instances, the methods further include dampening a soft decision corresponding to an element of the second hard decision data at a location in the set of conflicts.

Turning to FIG. 1, a storage system 100 is shown that includes a read channel circuit 110 having directed soft data perturbation circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data accessed from disk platter 178 is processed using a layered decoding algorithm. The layered decoding algorithm utilizes a layer complete list to maintain a map of layers that have completed without conflicts between the layers. In some embodiments, the soft data in one or more layers is modified around locations of conflict. The data processing including layered decoding may be implemented similar to that discussed below in relation to FIG. 4. The data processing may be completed using a method such as that discussed in relation to FIGS. 5A-5B and 6-8.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
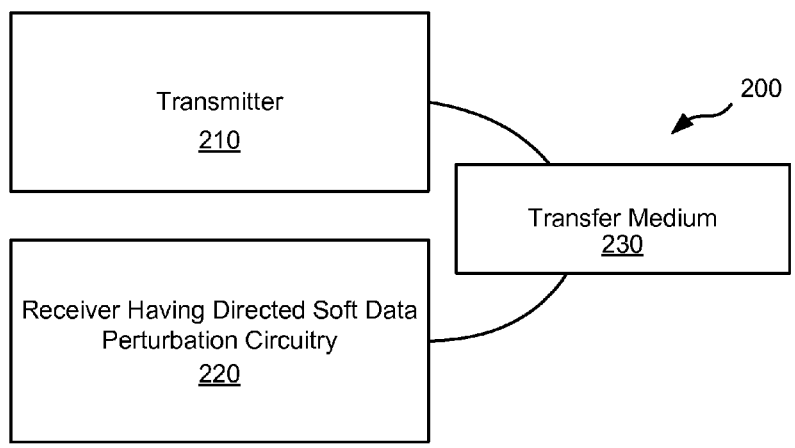
FIG. 2 depicts a data transmission device including a receiver having directed soft data perturbation circuitry in accordance with one or more embodiments of the present invention.

Turning to FIG. 2, a data transmission system 200 including a receiver 220 having directed soft data perturbation circuitry in accordance with one or more embodiments of the present invention. A transmitter 210 transmits encoded data via a transfer medium 230 as is known in the art. The encoded data is received from transfer medium 230 by receiver 220.

In operation, data received by receiver 220 is processed using a layered decoding algorithm. The layered decoding algorithm utilizes a layer complete list to maintain a map of layers that have completed without conflicts between the layers. In some embodiments, the soft data in one or more layers is modified around locations of conflict. The data processing including layered decoding may be implemented similar to that discussed below in relation to FIG. 4. The data processing may be completed using a method such as that discussed in relation to FIGS. 5A-5B and 6-8.

Figure 3:
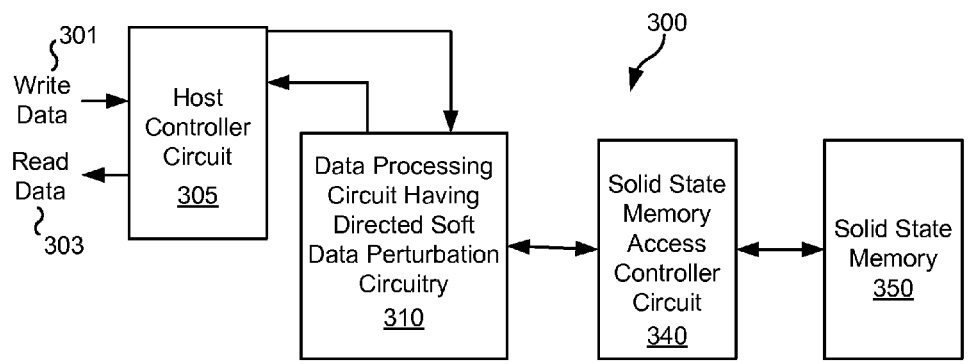
FIG. 3 a solid state memory circuit including a data processing circuit having directed soft data perturbation circuitry in accordance with some embodiments of the present invention.

Turning to FIG. 3, another storage system 300 is shown that includes a data processing circuit 310 having directed soft data perturbation circuitry in accordance with one or more embodiments of the present invention. A host controller circuit 305 receives data to be stored (i.e., write data 301). Solid state memory access controller circuit 340 may be any circuit known in the art that is capable of controlling access to and from a solid state memory. Solid state memory access controller circuit 340 formats the received encoded data for transfer to a solid state memory 350. Solid state memory 350 may be any solid state memory known in the art. In some embodiments of the present invention, solid state memory 350 is a flash memory. Later, when the previously written data is to be accessed from solid state memory 350, solid state memory access controller circuit 340 requests the data from solid state memory 350 and provides the requested data to data processing circuit 310. In turn, data processing circuit 310 processes the requested data using a layered decoding algorithm. The layered decoding algorithm utilizes a layer complete list to maintain a map of layers that have completed without conflicts between the layers. In some embodiments, the soft data in one or more layers is modified around locations of conflict. The data processing including layered decoding may be implemented similar to that discussed below in relation to FIG. 4. The data processing may be completed using a method such as that discussed in relation to FIGS. 5A-5B and 6-8.

Figure 4:
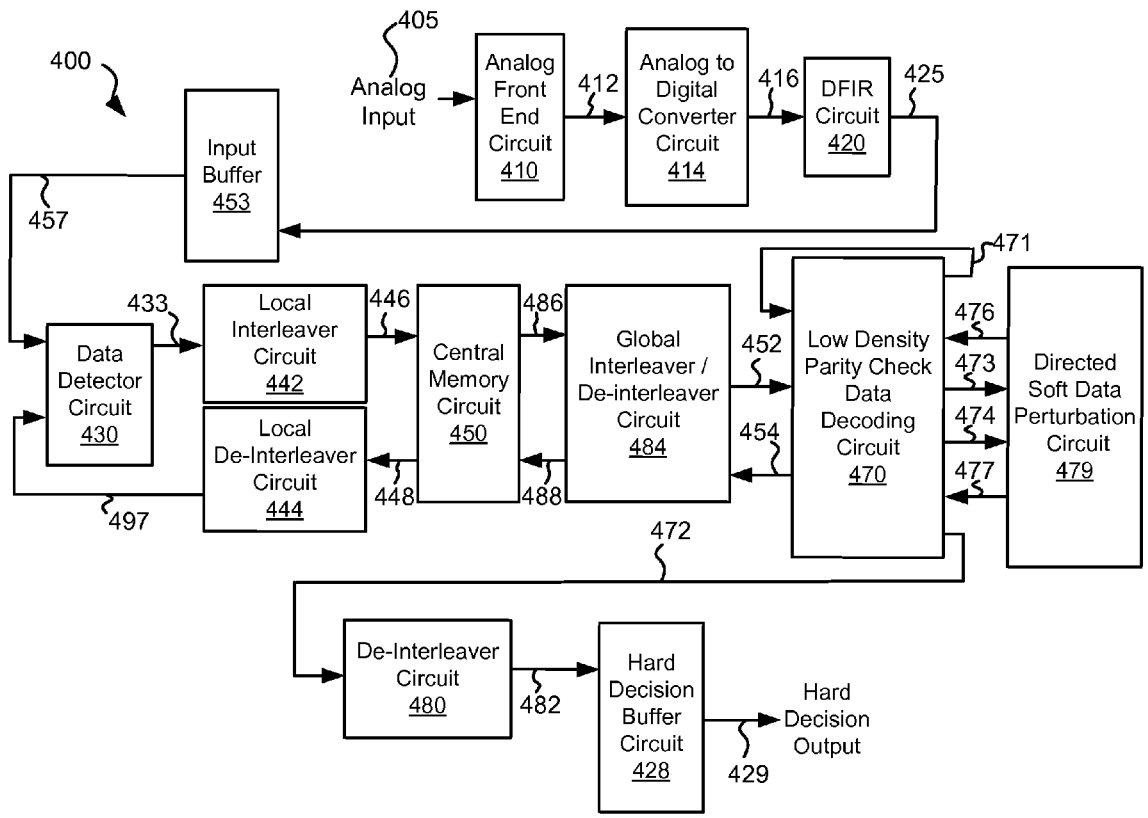
FIG. 4 depicts a data processing system including a directed soft data perturbation circuit in part governing operation of a data decoding circuit in accordance with various embodiments of the present invention.

Turning to FIG. 4, a data processing system 400 including a directed soft data perturbation circuit 479 in part governing operation of a data decoding circuit 470 in accordance with various embodiments of the present invention. Data processing system 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog signal 405 is derived from a read/write head assembly (not shown) that is disposed in relation to a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter circuit as are known in the art. It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input. Equalized output 425 is stored to an input buffer 453 that includes sufficient memory to maintain a number of codewords until processing of that codeword is completed through a data detector circuit 430 and low density parity check (LDPC) decoding circuit 470 including, where warranted, multiple global iterations (passes through both data detector circuit 430 and LDPC decoding circuit 470) and/or local iterations (passes through LDPC decoding circuit 470 during a given global iteration). An output 457 is provided to data detector circuit 430.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Local interleaver circuit 442 may be any circuit known in the art that is capable of shuffling data sets to yield a re-arranged data set. Interleaved codeword 446 is stored to central memory circuit 450.

Once LDPC decoding circuit 470 is available, a previously stored interleaved codeword 446 is accessed from central memory circuit 450 as a stored codeword 486 and globally interleaved by a global interleaver/de-interleaver circuit 484. Global interleaver/de-interleaver circuit 484 may be any circuit known in the art that is capable of globally rearranging codewords. Global interleaver/De-interleaver circuit 484 provides a decoder input 452 into LDPC decoding circuit 470. LDPC decoding circuit 470 applies one or more iterations or a layered data decoding algorithm to decoder input 452 to yield a decoded output 471. In cases where another local iteration (i.e., another pass through LDPC decoding circuit 470) is desired (i.e., decoding failed to converge and more local iterations are allowed), LDPC decoding circuit 470 re-applies the layered data decoding algorithm to decoder input 452 guided by decoded output 471. This continues until either a maximum number of local iterations is exceeded or decoded output 471 converges (i.e., completion of standard processing).

In one embodiment of the present invention, a directed soft data perturbation circuit 479 maintains a CZS list indicating layers that completely agreed on the hard decision values of all variables nodes of the layered data decoding algorithm. Any change in a hard decision indicates that the syndrome values corresponding to the old value of this bit are no longer valid and need to be revisited, and as such the size of the CZS list is reduced to only include layers which are in complete agreement. Of note, a change in a hard decision between layers does not trigger a recalculation of the whole syndrome for the previously decoded conflicting layer. The syndrome is calculated only for the current layer, which reduces unnecessary calculation of layer syndromes at each layer processing.

In operation, LDPC decoding circuit 470 applies a local iteration to a layer of decoder input 452 to yield a syndrome that is provided to directed soft data perturbation circuit 479 as a syndrome value 473 along with the hard decisions and/or soft decisions for the layer that are provided as a data output 474. Where syndrome value 473 is non-zero, directed soft data perturbation circuit 479 empties the CZS list.

Alternatively, where syndrome value 473 is zero (e.g., all of the parity check equations resolve), directed soft data perturbation circuit 479 determines whether any of the hard decisions for the current layer are in conflict with any of the hard decisions from other layers identified in the CZS list. This is done by assuring that each hard decision in the current result (i.e., the hard decisions for the current layer) is the same as each result from the other layers indicated in the CZS list for the same column position. FIG. 9 shows an example parity check matrix 900 including rows 910a-910f that are processed as layers, and columns 920a-920p that are used to compare with other layers. Elements 0-49 indicate locations of hard decisions in parity check matrix. Using parity check matrix as an example and assuming the most recently processed layer corresponds to row 910c and the CZS list only includes hard decisions corresponding to row 910a (i.e., the L[i−2] layer and row 910b is the L[i−1] layer) layer, then checking to assure that the hard decision in the current result is the same as each result from the other layers indicated in the CZS list for the same column position includes: assuring that a hard decision 16 is the same as a hard decision 1 (i.e., there are no conflicts between the hard decisions in column 920c); assuring that a hard decision 17 is the same as a hard decision 9 (i.e., there are no conflicts between the hard decisions in column 920d); assuring that a hard decision 18 is the same as a hard decision 10 (i.e., there are no conflicts between the hard decisions in column 920e); assuring that a hard decision 20 is the same as a hard decision 3 (i.e., there are no conflicts between the hard decisions in column 920h); assuring that a hard decision 21 is the same as a hard decision 13 (i.e., there are no conflicts between the hard decisions in column 920j); and assuring that a hard decision 24 is the same as a hard decision 6 (i.e., there are no conflicts between the hard decisions in column 920p).

Where directed soft data perturbation circuit 479 determines that the current layer does not have any conflicts with any of the other layers in the CZS list, the current layer is added to the CZS list. Thus, using the preceding example that refers to FIG. 9 where it is found that hard decision 16 is the same as a hard decision 1, hard decision 17 is the same as a hard decision 9, hard decision 18 is the same as a hard decision 10, hard decision 20 is the same as a hard decision 3, hard decision 21 is the same as a hard decision 13, and hard decision 24 is the same as a hard decision 6, then the CZS list is augmented to include the L[i] corresponding to row 910c in addition to the layers corresponding to rows 910a and 910b. Directed soft data perturbation circuit 479 then determines whether the CZS list has achieved its maximum list size. The maximum size of the CZS list is the number of layers in the parity matrix. Again, using parity matrix 900 of FIG. 9, the maximum size is six (i.e., the number of rows 910a-910f). Based upon the disclosure provided herein, one of ordinary skill in the art will recognize other numbers of layers that may be processed in accordance with different embodiments of the present invention. Where the CZS list is the maximum list size, then all of the errors have been corrected and the layered decode algorithm is considered to have converged which is indicated to LDPC decoding circuit 470 as a convergence indicator 476.

Alternatively, where it is determined that the current layer does have conflicts with any of the other layers in the CZS list, directed soft data perturbation circuit 479 identifies the latest layer exhibiting a conflict with the current layer. Thus, using the preceding example that refers to FIG. 9, where the only conflict is that hard decision 16 is not the same as hard decision 1, then the latest layer exhibiting a conflict is the layer corresponding to row 910*a*. Directed soft data perturbation circuit 479 updates the CZS list to include the most recent layer and all other layers forming a continuous set of layers back to the latest layer exhibiting a conflict. Thus, using the preceding example that refers to FIG. 9 and assuming the current layer corresponds to row 910*c* and the latest layer exhibiting a conflict is the second preceding layer (i.e., the L[i−2] layer is the second preceding layer and the L[i−1] layer is the first preceding layer) layer and the current layer corresponding to row 910*a*, then the CZS list is modified by directed soft data perturbation circuit 479 to include the current layer corresponding to row 910*c* and first preceding layer corresponding to row 910*b*.

Directed soft data perturbation circuit 479 determines whether the current layer is the last layer in decoder input 452. Thus, using parity check matrix 900 as an example, the maximum value of the layer counter is six (i.e., the number of rows 910*a*-910*f*). Again, based upon the disclosure provided herein, one of ordinary skill in the art will recognize other numbers of layers that may be processed in accordance with different embodiments of the present invention. Where directed soft data perturbation circuit 479 determines that the current layer is not the last layer in decoder input 452, the next layer is selected and the aforementioned processing is performed on the next layer.

Alternatively, where directed soft data perturbation circuit 479 determines that the current layer is the last layer in decoder input 452, it is determined by directed soft data perturbation circuit 479 whether another local iteration is to be performed. In some cases, ten local iterations are allowed per each global iteration. Based upon the disclosure provided herein, one of ordinary skill in the art will recognize another number of local iterations that may be used in relation to different embodiments of the present invention. Where another local iteration is desired, the initial layer in decoder input 452 is selected and the aforementioned processing is performed on the initial layer. Alternatively, where no additional local iterations of the layered data decode algorithm are desired, then a failure to converge is indicated via convergence indicator 476.

In another embodiment of the present invention, directed soft data perturbation circuit 479 similarly maintains a CZS list indicating layers that completely agreed (after modification) on the hard decision values of all variables nodes of the layered data decoding algorithm. In this approach, when a codeword is close to convergence changing a limited number of hard decision values allows for reducing the number of hard decision conflicts and thereby artificially increasing the size of the CZS list that is maintained without divergence. In some cases, the reversal of the conflicts in the hard decisions may be done by changing the sign of the a posteriori LLR data of a current layer or the latest layer exhibiting a conflict. Such an a posteriori LLR data is obtained by adding the variable node to check node message of the current bit or symbol to the check node to variable node message from the last non-zero circulant at the same column. In some cases, a counter of how many hard decision modifications of the current variable bit occurred since the start of decoding helps to decide whether the current bit is a reliable candidate for hard decision modification. Where the syndrome of a current layer is non-zero, an odd number of hard decision modifications is needed to make the current syndrome value zero and increase the size of the CZS list. In some embodiments, there is a budget of allowable number of hard decision modifications per layer and another budget of an overall number of hard decision modifications that are allowed for the combined layers. Limiting the number of allowable hard decision modifications reduces the possibility of increased mis-correction probability.

In operation, LDPC decoding circuit 470 applies a local iteration to a layer of decoder input 452 to yield a syndrome that is provided to directed soft data perturbation circuit 479 as a syndrome value 473 along with the hard decisions and/or soft decisions for the layer that are provided as a data output 474. Where syndrome value 473 is non-zero, directed soft data perturbation circuit 479 determines whether the size of the CZS list exceeds an interim threshold. The interim size is a size sufficient to indicate that the currently processing codeword is close to convergence. As one example, the interim size may be a size within three of a full CZS list. Based upon the disclosure provided herein, one of ordinary skill in the art may recognize other sizes that may be used as the interim size in accordance with different embodiments of the present invention.

Where directed soft data perturbation circuit 479 determines that the CZS list is not greater than the interim size, the CZS list is emptied. Alternatively, where it is determined that the CZS list is greater than the interim size, it is determined whether a limited, odd number of location value changes can be identified to make the syndrome equal to zero (i.e., can a limited, odd number of decision flips yield a syndrome of zero for the current layer?). As used herein, a "location value change" is used in its broadest sense to mean the modification of either or both hard or soft decision data for a particular bit or symbol. In some embodiments of the present invention, the limited, odd number of location value changes is less than ten percent of the number of bits or symbols for a given layer. Where such value changes are not capable of yielding a value of zero for the syndrome, the CZS list is emptied. Alternatively, where such value changes are capable of yielding a value of zero for the syndrome, the value changes are made by directed soft data perturbation circuit 479. The data including the location value changes is returned to LDPC decoder circuit 470 as a data return 477 and used to guide the next iteration of LDPC data decoding circuit 470.

Alternatively, where syndrome value 473 is zero (e.g., all of the parity check equations resolve), directed soft data perturbation circuit 479 determines whether any of the hard decisions for the current layer are in conflict with any of the hard decisions from other layers identified in the CZS list. This is done by assuring that each hard decision in the current result (i.e., the hard decisions for the current layer) is the same as each result from the other layers indicated in the CZS list for the same column position. Again, FIG. 9 shows an example parity check matrix 900 including rows 910*a*-910*f* that are processed as layers, and columns 920*a*-920*p* that are used to compare with other layers. Elements 0-49 indicate locations of hard decisions in parity check matrix. Using parity check matrix as an example and assuming the most recently processed layer corresponds to row 910*c* and the CZS list only includes hard decisions corresponding to row 910*a* layer, then checking to assure that the hard decision in the current result is the same as each result from the other layers indicated in the CZS list for the same column position includes: assuring that a hard decision 16 is the same as a hard decision 1 (i.e., there are no conflicts between the hard decisions in column 920c); assuring that a hard decision 17 is the same as a hard decision 9 (i.e., there are no conflicts between the hard decisions in column 920d); assuring that a hard decision 18 is the same as a hard decision 10 (i.e., there are no conflicts between the hard decisions in column 920e); assuring that a hard decision 20 is the same as a hard decision 3 (i.e., there are no conflicts between the hard decisions in column 920h); assuring that a hard decision 21 is the same as a hard decision 13 (i.e., there are no conflicts between the hard decisions in column 920j); and assuring that a hard decision 24 is the same as a hard decision 6 (i.e., there are no conflicts between the hard decisions in column 920p).

Where directed soft data perturbation circuit 479 determines that the current layer does not have any conflicts with any of the other layers in the CZS list, the current layer is added to the CZS list maintained by directed soft data perturbation circuit 479. Thus, using the preceding example that refers to FIG. 9 where it is found that hard decision 16 is the same as a hard decision 1, hard decision 17 is the same as a hard decision 9, hard decision 18 is the same as a hard decision 10, hard decision 20 is the same as a hard decision 3, hard decision 21 is the same as a hard decision 13, and hard decision 24 is the same as a hard decision 6, then the CZS list is augmented to include the current layer corresponding to row 910c in addition to the layers corresponding to rows 910a and 910b. Directed soft data perturbation circuit 479 then determines whether the CZS list has achieved its maximum list size. The maximum size of the CZS list is the number of layers in the parity matrix. Again, using parity matrix 900 of FIG. 9, the maximum size is six (i.e., the number of rows 910a-910f). Based upon the disclosure provided herein, one of ordinary skill in the art will recognize other numbers of layers that may be processed in accordance with different embodiments of the present invention. Where directed soft data perturbation circuit 479 is the maximum list size, then all of the errors have been corrected and the layered decode algorithm is considered to have converged which is indicated via convergence indicator 476.

Alternatively, where it is determined that the current layer does have conflicts with any of the other layers in the CZS list, directed soft data perturbation circuit 479 identifies the latest layer exhibiting a conflict with the current layer. Thus, using the preceding example that refers to FIG. 9, where the only conflict is that hard decision 16 is not the same as hard decision 1, then the latest layer exhibiting a conflict is the layer corresponding to row 910a. In addition, it is determined whether a limited, even number of decision flips can be identified to make the latest layer exhibiting a conflict farther in the past (i.e., can a limited, even number of decision flips increase the distance between the current layer and the layer exhibiting a conflict?). As used herein, a "decision flip" is used in its broadest sense to mean the modification of a hard decision value. In the case of binary decoding, a decision flip is the change of a hard decision from one binary state to another binary state. In some embodiments of the present invention, the limited, even number of decision flips is less than one percent of the number of hard decisions in a given layer. Based upon the disclosure provided herein, one of ordinary skill in the art will recognize other numbers that may be used in relation to different embodiments of the present invention. As an example, assume that the second previous layer exhibits four conflicts with the current layer, that the number four is less than or equal to the limited, even number of decision flips, and that flipping the decisions in the second previous layer resolves all conflicts between the current layer and the fifth preceding layer (i.e., the L[i−5] layer), then the condition is met.

Where the condition is met, the identified conflicting hard decisions are modified by directed soft data perturbation circuit to resolve the conflict, and the process of identifying the new latest layer exhibiting a conflict with the current layer and whether the list size can be further increased. Alternatively, where the condition is not met, directed soft data perturbation circuit 479 the CZS list is updated to include the current layer and all other layers forming a continuous set of layers back to the latest layer exhibiting a conflict. Thus, using the previously discussed example where the next conflict is with the L[i−5] layer, then the CZS list is modified to include the L[i] layer, the L[i−1] layer, the L[i−2] layer, the L[i−3] layer and the L[i−4] layer. The data including the location value changes is returned to LDPC decoder circuit 470 as a data return 477 and used to guide the next iteration of LDPC data decoding circuit 470.

Directed soft data perturbation circuit 479 determines whether the current layer is the last layer in decoder input 452. Thus, using parity check matrix 900 as an example, the maximum value of the layer counter is six (i.e., the number of rows 910a-910f). Again, based upon the disclosure provided herein, one of ordinary skill in the art will recognize other numbers of layers that may be processed in accordance with different embodiments of the present invention. Where directed soft data perturbation circuit 479 determines that the current layer is not the last layer in decoder input 452, the next layer is selected and the aforementioned processing is performed on the next layer.

Alternatively, where directed soft data perturbation circuit 479 determines that the current layer is the last layer in decoder input 452, it is determined by directed soft data perturbation circuit 479 whether another local iteration is to be performed. In some cases, ten local iterations are allowed per each global iteration. Based upon the disclosure provided herein, one of ordinary skill in the art will recognize another number of local iterations that may be used in relation to different embodiments of the present invention. Where another local iteration is desired, the initial layer in decoder input 452 is selected and the aforementioned processing is performed on the initial layer. Alternatively, where no additional local iterations of the layered data decode algorithm are desired, then a failure to converge is indicated via convergence indicator 476.

In yet another embodiment of the present invention, directed soft data perturbation circuit 479 similarly maintains a CZS list indicating layers that completely agreed on the hard decision values of all variables nodes of the layered data decoding algorithm. This approach relies on a presumption that where hard decision conflicts are identified, it is an indication of weak confidence at that location. The approach reduces the soft data corresponding to locations where there is a hard decision conflict, thus causing the next local iteration and/or global iteration to make changes to that location. While not specifically disclosed herein, it should be noted that such soft data dampening may be combined with the previously discussed hard decision modification. In some cases, the soft data dampening may be implemented by multiplying the soft data by a scalar value. In some cases, the scalar value is user programmable. A more aggressive dampening (i.e., use of a lower scalar value) may be used as convergence is closer. Said another way, the scalar may be varied as a function of the size of the CZS list. In one particular embodiment of the present invention, a larger CZS list indicates a closer convergence and thus a lower scalar value is selected compared with a smaller scalar value selected for a smaller CZS list. As one particular example, where the CZS list is less than three layers, a scalar value of 0.7 is used. Where the CZS list grows to five layers, a scalar value of 0.5 is used. Where the CZS list grows to seven layers, a scalar value of 0.3 is used. Based upon the disclosure provided herein, one of ordinary skill in the art will recognize other scalar values that may be used as a function of the size of the CZS list. Alternatively, the scalar value may be selected as a function of how often a particular hard decision has been modified. A large number of modifications indicating a weaker confidence, and thus a lower scalar value.

In operation, LDPC decoding circuit 470 applies a local iteration to a layer of decoder input 452 to yield a syndrome that is provided to directed soft data perturbation circuit 479 as a syndrome value 473 along with the hard decisions and/or soft decisions for the layer that are provided as a data output 474. Where syndrome value 473 is non-zero, directed soft data perturbation circuit 479 empties the CZS list.

Alternatively, where syndrome value 473 is zero (e.g., all of the parity check equations resolve), directed soft data perturbation circuit 479 determines whether any of the hard decisions for the current layer are in conflict with any of the hard decisions from other layers identified in the CZS list. This is done by assuring that each hard decision in the current result (i.e., the hard decisions for the current layer) is the same as each result from the other layers indicated in the CZS list for the same column position. Again, FIG. 9 shows an example parity check matrix 900 including rows 910a-910f that are processed as layers, and columns 920a-920p that are used to compare with other layers. Elements 0-49 indicate locations of hard decisions in parity check matrix. Using parity check matrix as an example and assuming the most recently processed layer corresponds to row 910c and the CZS list only includes hard decisions corresponding to row 910a (i.e., the L[i−2] layer and row 910b is the L[i−1] layer) layer, then checking to assure that the hard decision in the current result is the same as each result from the other layers indicated in the CZS list for the same column position includes: assuring that a hard decision 16 is the same as a hard decision 1 (i.e., there are no conflicts between the hard decisions in column 920c); assuring that a hard decision 17 is the same as a hard decision 9 (i.e., there are no conflicts between the hard decisions in column 920d); assuring that a hard decision 18 is the same as a hard decision 10 (i.e., there are no conflicts between the hard decisions in column 920e); assuring that a hard decision 20 is the same as a hard decision 3 (i.e., there are no conflicts between the hard decisions in column 920h); assuring that a hard decision 21 is the same as a hard decision 13 (i.e., there are no conflicts between the hard decisions in column 920j); and assuring that a hard decision 24 is the same as a hard decision 6 (i.e., there are no conflicts between the hard decisions in column 920p).

Where directed soft data perturbation circuit 479 determines that the current layer does not have any conflicts with any of the other layers in the CZS list, the current layer is added to the CZS list by directed soft data perturbation circuit 479. Thus, using the preceding example that refers to FIG. 9 where it is found that hard decision 16 is the same as a hard decision 1, hard decision 17 is the same as a hard decision 9, hard decision 18 is the same as a hard decision 10, hard decision 20 is the same as a hard decision 3, hard decision 21 is the same as a hard decision 13, and hard decision 24 is the same as a hard decision 6, then the CZS list is augmented to include the cureent layer corresponding to row 910c in addition to the layers corresponding to rows 910a and 910b. Directed soft data perturbation circuit 479 then determines whether the CZS list has achieved its maximum list size. The maximum size of the CZS list is the number of layers in the parity matrix. Again, using parity matrix 900 of FIG. 9, the maximum size is six (i.e., the number of rows 910a-910f). Based upon the disclosure provided herein, one of ordinary skill in the art will recognize other numbers of layers that may be processed in accordance with different embodiments of the present invention. Where the CZS list is the maximum list size, then all of the errors have been corrected and the layered decode algorithm is considered to have converged which is indicated to LDPC decoding circuit 470 as a convergence indicator 476.

Alternatively, where it is determined that the current layer does have conflicts with any of the other layers in the CZS list, the latest layer exhibiting a conflict with the current layer is identified. Thus, using the preceding example that refers to FIG. 9, where the only conflict is that hard decision 16 is not the same as hard decision 1, then the latest layer exhibiting a conflict is the layer corresponding to row 910a. Further, directed soft data perturbation circuit 479 dampens soft decision data corresponding to the locations of the hard decision conflicts. Again, this may be done, for example, by multiplying the LLR data corresponding to the conflicted hard decision by a scalar value. The scalar value may be a fixed scalar value that may be, for example, user programmable. Alternatively, the scalar value may vary as a function of either the size of the CZS list or as a function of the number of hard decision modifications that have been made at the particular position. The CZS list is updated to include the current layer and all other layers forming a continuous set of layers back to the latest layer exhibiting a conflict. Thus, using the preceding example that refers to FIG. 9 and assuming the L[i] layer corresponds to row 910c and the latest layer exhibiting a conflict is the L[i−2] layer corresponding to row 910a, then the CZS list is modified to include the L[i] layer corresponding to row 910c and the L[i−1] layer corresponding to row 910b. The data including the dampened soft data is returned to LDPC decoder circuit 470 as a data return 477 and used to guide the next iteration of LDPC data decoding circuit 470.

Directed soft data perturbation circuit 479 determines whether the current layer is the last layer in decoder input 452. Thus, using parity check matrix 900 as an example, the maximum value of the layer counter is six (i.e., the number of rows 910a-910f). Again, based upon the disclosure provided herein, one of ordinary skill in the art will recognize other numbers of layers that may be processed in accordance with different embodiments of the present invention. Where directed soft data perturbation circuit 479 determines that the current layer is not the last layer in decoder input 452, the next layer is selected and the aforementioned processing is performed on the next layer.

Alternatively, where directed soft data perturbation circuit 479 determines that the current layer is the last layer in decoder input 452, it is determined by directed soft data perturbation circuit 479 whether another local iteration is to be performed. In some cases, ten local iterations are allowed per each global iteration. Based upon the disclosure provided herein, one of ordinary skill in the art will recognize another number of local iterations that may be used in relation to different embodiments of the present invention. Where another local iteration is desired, the initial layer in decoder input 452 is selected and the aforementioned processing is performed on the initial layer. Alternatively, where no additional local iterations of the layered data decode algorithm are desired, then a failure to converge is indicated via convergence indicator 476.

Where decoded output 471 fails to converge (i.e., fails to yield the originally written data set) and a number of local iterations through LDPC decoding circuit 470 exceeds a threshold, but an allowable number of global iterations is not yet exceeded, the resulting decoded output is provided as a decoded output 454 back to central memory circuit 450 where it is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 is accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output converges (i.e., yields the originally written data set), the resulting decoded output is provided as an output codeword 472 to a de-interleaver circuit 480 that rearranges the data to reverse both the global and local interleaving applied to the data to yield a de-interleaved output 482. De-interleaved output 482 is provided to a hard decision buffer circuit 428 buffers de-interleaved output 482 as it is transferred to the requesting host as a hard decision output 429.

As yet another alternative, where decoded output 471 fails to converge (i.e., fails to yield the originally written data set), a number of local iterations through LDPC decoding circuit 470 exceeds a threshold, and a number of global iterations through data detector circuit 430 and LDPC data decoding circuit 470 exceeds a threshold, the result of the last pass through LDPC decoding circuit 470 is provided as a decoded output along with an error indicator (not shown).

Turning to FIG. 5A, a flow diagram 500 shows a method for data processing including data detection that may be used in relation to one or more embodiments of the present invention. Following flow diagram 500, it is determined whether a data set or codeword is ready for application of a data detection algorithm (block 505). In some cases, a data set is ready when it is received from a data decoder circuit via a central memory circuit. In other cases, a data set is ready for processing when it is first made available from a front end processing circuit. Where a data set is ready (block 505), it is determined whether a data detector circuit is available to process the data set (block 510).

Where the data detector circuit is available for processing (block 510), the data set is accessed by the available data detector circuit (block 515). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 520). Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 525). The derivative of the detected output may be, for example, an interleaved or shuffled version of the detected output.

Figure 5B:
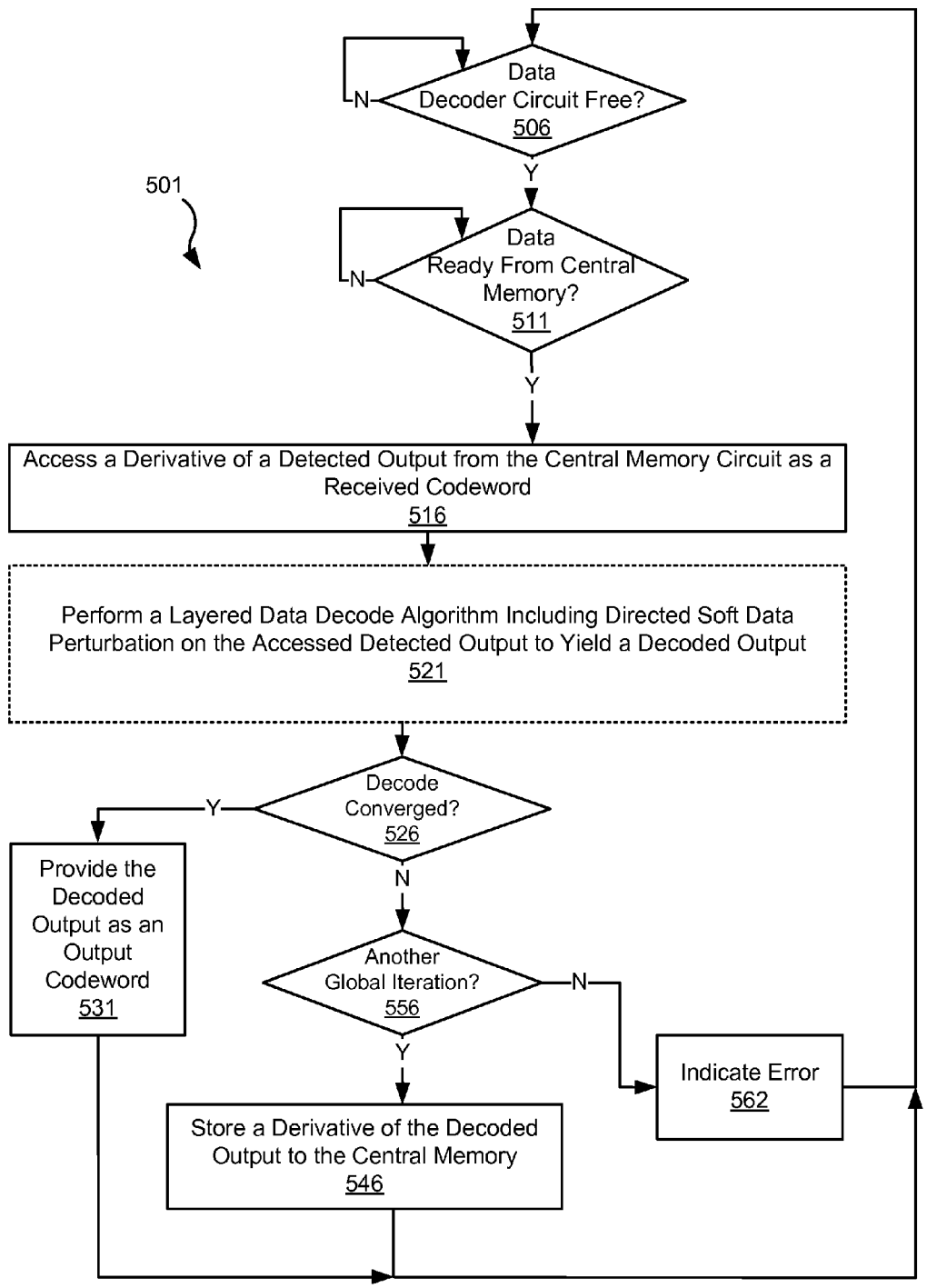

Turning to FIG. 5B, a flow diagram 501 shows a counterpart of the method described above in relation to FIG. 5A. Following flow diagram 501, in parallel to the previously described data detection process of FIG. 5A, it is determined whether a data decoder circuit is available (block 506). The data decoder circuit may be a low density data decoder circuit in accordance with one or more embodiments of the present invention. Where the data decoder circuit is available (block 506), it is determined whether a derivative of a detected output is available for processing in the central memory (block 511). Where such a data set is ready (block 511), the previously stored derivative of a detected output is accessed from the central memory and used as a received codeword (block 516).

A layered decode algorithm including directed soft data perturbation on the accessed detected output is applied to yield a decoded output (block 521). This block is shown in dashed lines as it may include different approaches for applying the algorithm. Different embodiments of the present invention apply different layered decoding algorithms similar to those discussed below in relation to FIGS. 6-8. LDPC message passing decoders are suboptimal decoding algorithms that iterate reliability messages between the parity checks functions until all checks agree on the hard decision values of the LDPC codewords. This indicates that the most likely codeword is found based on the noisy received codeword. During iterative decoding, the LLR of the bit nodes may oscillate between different signs delaying the convergence of the decoder or preventing the decoder from converging to a codeword by the maximum allowed number of iterations. In some examples where flash memories are used, in the beginning of life or for high reliability cells like single level cells, few errors exist and directed flipping of a few LLR can lead to the correct codeword and prevent the decoder from being trapped in a "near codeword" or a trapping set. In addition saturated LLR is the only available information in normal mode decoding and higher precision LLR is only available in retry to improve overall system throughput, as soft LLR require multiple slow flash reads to obtain. Instead of implementing two decoding engines, a directed bit flipping type decoder for normal mode operation at the beginning of life, and a message passing decoder for retry at the end of life, a thin layer of directed decision flipping is added to the message passing decoder that is guided by hard decision oscillations and dynamic syndrome calculation.

To facilitate the aforementioned processing, a running list of layers that resulted in zero syndromes is maintained (i.e, the CZS List). Any change in a hard decision indicates that the syndrome values corresponding to the old value of this bit are no longer valid and need to be revisited. Which reduces the size of the running list to a smaller value. In various embodiments of the present invention, a change in a hard decision does not trigger a recalculation of the whole syndrome. The syndrome is calculated only for the current layer, which reduces unnecessary calculation of layer syndromes at each layer processing. Such approaches are most useful for sparse low column weight H-matrices, because method utilizes the fact that current circulant in current layer shares variable nodes with a smaller number of previous layers. In some cases, the approaches only save hard decision outputs corresponding to the last non-zero circulant sharing a variable node with current non-zero circulant in current layer, and all such information is already naturally saved in layered LDPC decoder architectures. By maintaining statistics on how often hard decision changes for the current bit or symbol, a measure of reliability is derived that prevents that bit or symbol from oscillating often and delaying convergence. The larger the CZS list becomes, the closer the layered data decoding algorithm is to a codeword and LLR perturbation is less likely to lead to divergence to another codeword or delaying the correction of authentic errors.

Figure 6:
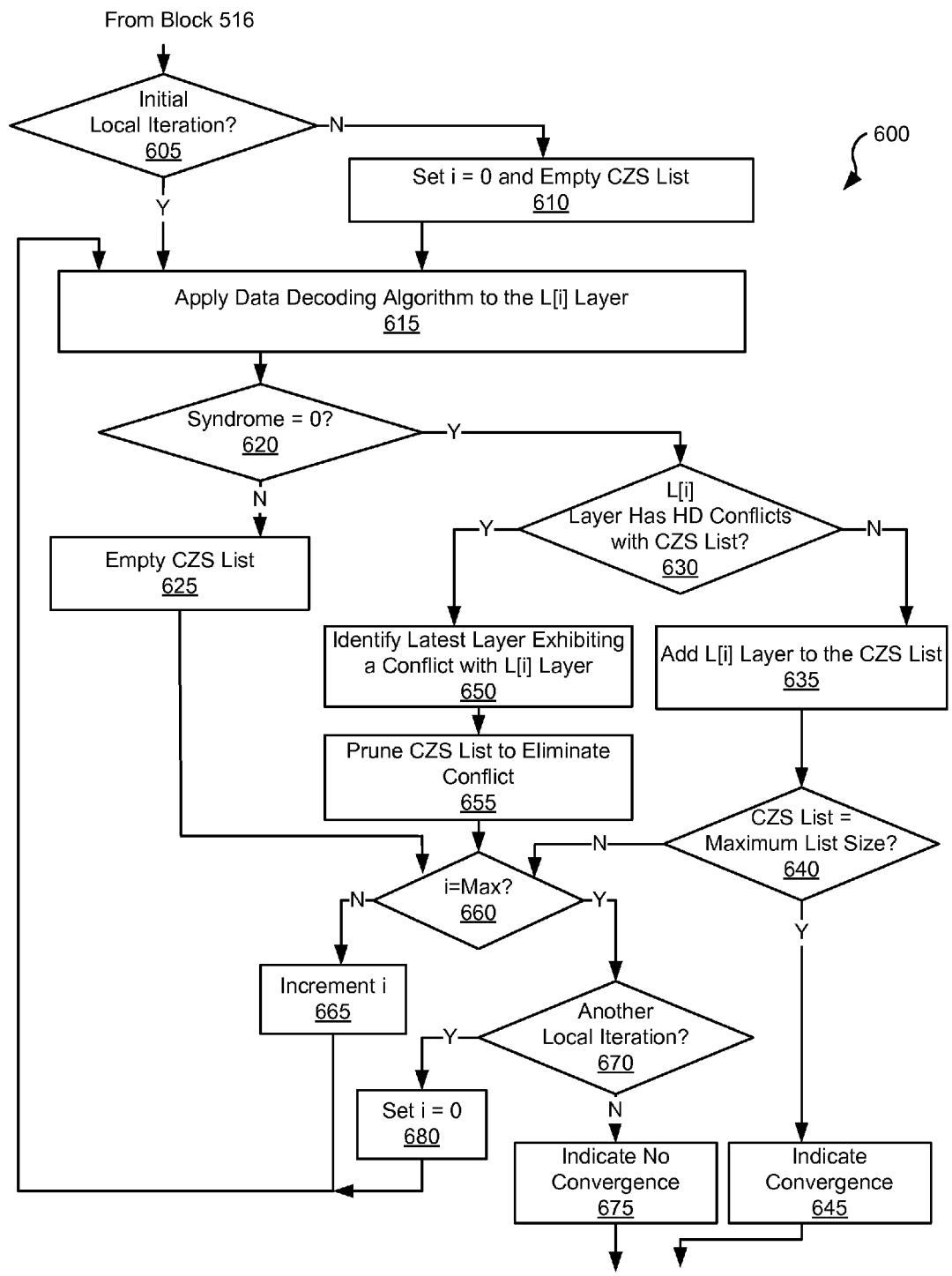
FIGS. 6-8 show different methods for layered decoding including directed soft data perturbation in accordance with various embodiments of the present invention.

Turning to FIG. 6, a flow diagram 600 shows one implementation of applying the layered decode algorithm of block 521 is discussed in accordance with some embodiments of the present invention. In the approach discussed in relation to FIG. 6, a CZS list is maintained for layers that completely agreed on the hard decision values of all variables nodes of the layered data decoding algorithm. Any change in a hard decision indicates that the syndrome values corresponding to the old value of this bit are no longer valid and need to be revisited, and as such the size of the CZS list is reduced to only include layers which are in complete agreement. Of note, a change in a hard decision between layers does not trigger a recalculation of the whole syndrome for the previously decoded conflicting layer. The syndrome is calculated only for the current layer, which reduces unnecessary calculation of layer syndromes at each layer processing. Following flow diagram 600, it is determined whether the next iteration is an initial local iteration of the layered data decode algorithm (block 605). Where it is the initial iteration of the layered decode algorithm (block 605), a layer counter (i) is set equal to zero and the "CZS List" is emptied (block 610).

A low density parity check decoding algorithm is applied to the layer of the decoder input indicated by the layer counter (i.e., the L[i] layer) (block 615). It is determined whether the processing during the low density parity check decoding resulted in a zero syndrome value (e.g., all parity check equations for the layer were resolved corrected)(block 620). Where the syndrome for the L[i] layer is not zero (i.e., an error remains in the layer) (block 620), the CZS list is emptied (block 625).

Alternatively, where the syndrome for the L[i] layer is zero (e.g., all of the parity check equations resolve) (block 620), it is determined whether any of the hard decisions for the current layer are in conflict with any of the hard decisions from other layers identified in the CZS list (block 630). This is done by assuring that each hard decision in the current result (i.e., the hard decisions for the L[i] layer) is the same as each result from the other layers indicated in the CZS list for the same column position. FIG. 9 shows an example parity check matrix 900 including rows 910a-910f that are processed as layers, and columns 920a-920p that are used to compare with other layers. Elements 0-49 indicate locations of hard decisions in parity check matrix. Using parity check matrix as an example and assuming the most recently processed layer corresponds to row 910c and the CZS list only includes hard decisions corresponding to row 910a (i.e., the L[i−2] layer and row 910b (i.e., the L[i−1]) layer, then checking to assure that the hard decision in the current result is the same as each result from the other layers indicated in the CZS list for the same column position includes: assuring that a hard decision 16 is the same as a hard decision 1 (i.e., there are no conflicts between the hard decisions in column 920c); assuring that a hard decision 17 is the same as a hard decision 9 (i.e., there are no conflicts between the hard decisions in column 920d); assuring that a hard decision 18 is the same as a hard decision 10 (i.e., there are no conflicts between the hard decisions in column 920e); assuring that a hard decision 20 is the same as a hard decision 3 (i.e., there are no conflicts between the hard decisions in column 920h); assuring that a hard decision 21 is the same as a hard decision 13 (i.e., there are no conflicts between the hard decisions in column 920j); and assuring that a hard decision 24 is the same as a hard decision 6 (i.e., there are no conflicts between the hard decisions in column 920p).

Where it is determined that the L[i] layer does not have any conflicts with any of the other layers in the CZS list (block 630), the L[i] layer is added to the CZS list (block 635). Thus, using the preceding example that refers to FIG. 9 where it is found that hard decision 16 is the same as a hard decision 1, hard decision 17 is the same as a hard decision 9, hard decision 18 is the same as a hard decision 10, hard decision 20 is the same as a hard decision 3, hard decision 21 is the same as a hard decision 13, and hard decision 24 is the same as a hard decision 6, then the CZS list is augmented to include the L[i] corresponding to row 910c in addition to the layers corresponding to rows 910a and 910b. It is then determined whether the CZS list has achieved its maximum list size (block 640). The maximum size of the CZS list is the number of layers in the parity matrix. Again, using parity matrix 900 of FIG. 9, the maximum size is six (i.e., the number of rows 910a-910f). Based upon the disclosure provided herein, one of ordinary skill in the art will recognize other numbers of layers that may be processed in accordance with different embodiments of the present invention. Where the CZS list is the maximum list size (block 640), then all of the errors have been corrected and the layered decode algorithm is considered to have converged which is indicated (block 645). Where such convergence is achieved, the process is returned to block 526 of FIG. 5B.

Alternatively, where it is determined that the L[i] layer does have conflicts with any of the other layers in the CZS list (block 630), the latest layer exhibiting a conflict with the L[i] layer is identified (block 650). Thus, using the preceding example that refers to FIG. 9, where the only conflict is that hard decision 16 is not the same as hard decision 1, then the latest layer exhibiting a conflict is the layer corresponding to row 910a. The CZS list is updated to include the most recent layer (i.e., the L[i] layer) and all other layers forming a continuous set of layers back to the latest layer exhibiting a conflict (block 655). Thus, using the preceding example that refers to FIG. 9 and assuming the L[i] layer corresponds to row 910c and the latest layer exhibiting a conflict is the L[i−2] layer corresponding to row 910a, then the CZS list is modified to include the L[i] layer corresponding to row 910c and the L[i−1] layer corresponding to row 910b.

It is then determined whether the layer counter (i) is a maximum value (block 660). The maximum value of the layer counter is the total number of layers less one. Thus, using parity check matrix 900 as an example, the maximum value of the layer counter is six (i.e., the number of rows 910a-910f). Again, based upon the disclosure provided herein, one of ordinary skill in the art will recognize other numbers of layers that may be processed in accordance with different embodiments of the present invention. Where the layer counter is less than the maximum value (block 660), the layer counter is incremented (block 665) and the processes discussed above in relation to blocks 615-660 is repeated for the next layer indicated by the layer counter (i.e., the L[i+1] layer).

Alternatively, where the layer counter is equal to the maximum value (block 660) indicating the completion of a local iteration of the data decoding algorithm, it is determined whether another local iteration is to be performed (block 670). In some cases, ten local iterations are allowed per each global iteration. Based upon the disclosure provided herein, one of ordinary skill in the art will recognize another number of local iterations that may be used in relation to different embodiments of the present invention. Where another local iteration is desired (block 670), the layer counter (i) is reset to zero (block 680) and the processes discussed above in relation to blocks 615-660 are repeated for the initial layer corresponding to a layer counter value of zero (i.e., the L[0] layer). Alternatively, where no additional local iterations of the layered data decode algorithm are desired (block 670), then a failure to converge is indicated (block 675) and the process is returned to block 526 of FIG. 5B.

Figure 7:
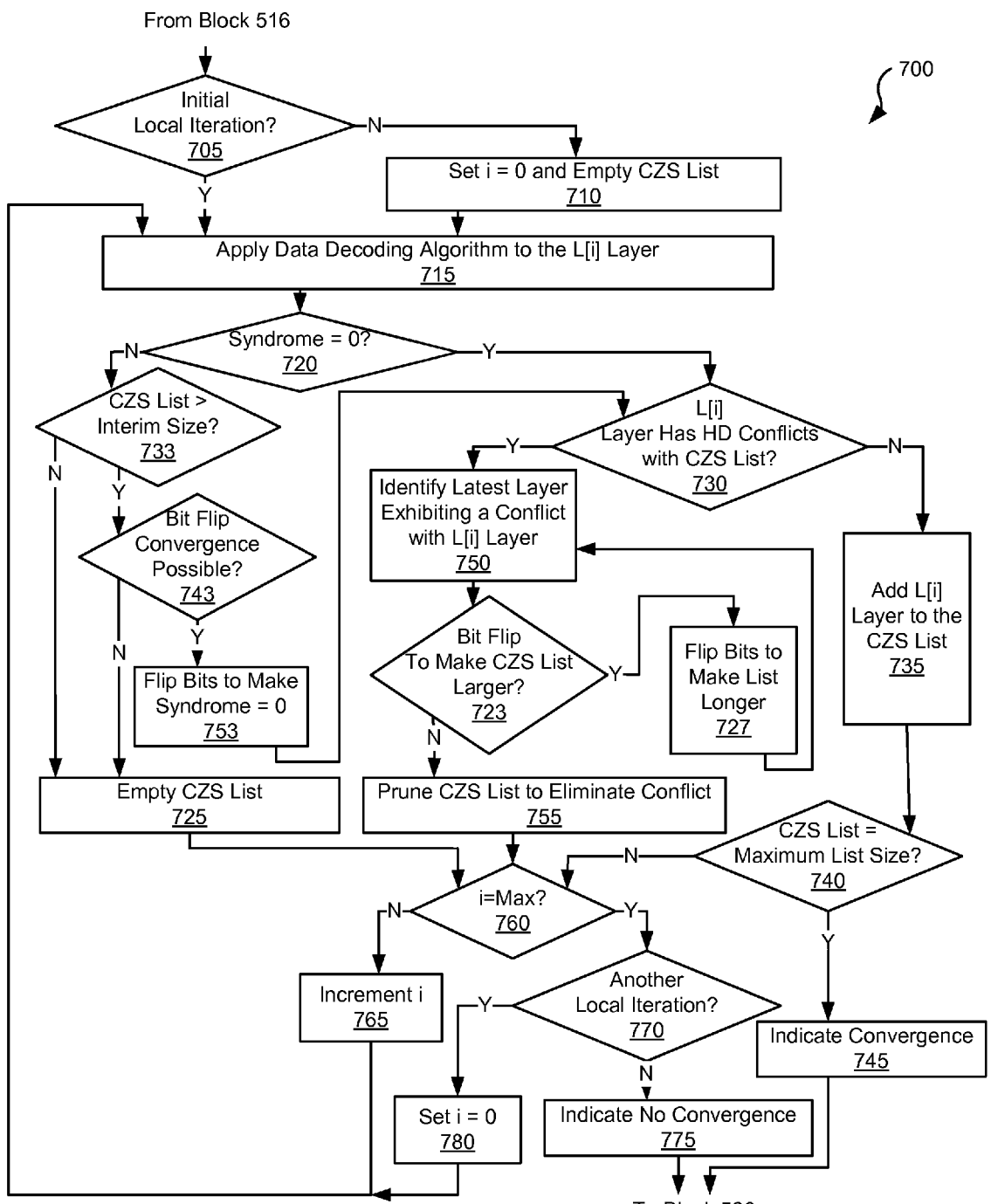

Turning to FIG. 7, another flow diagram 700 shows one implementation of applying the layered decode algorithm of block 521 is discussed in accordance with some embodiments of the present invention. In this approach, when a codeword is close to convergence changing a limited number of hard decision values allows for reducing the number of hard decision conflicts and thereby artificially increasing the size of the CZS list that is maintained without divergence. In some cases, the reversal of the conflicts in the hard decisions may be done by changing the sign of the a posteriori LLR data of a current layer or the latest layer exhibiting a conflict. Such an a posteriori LLR data is obtained by adding the variable node to check node message of the current bit or symbol to the check node to variable node message from the last non-zero circulant at the same column. In some cases, a counter of how many hard decision modifications of the current variable bit occurred since the start of decoding helps to decide whether the current bit is a reliable candidate for hard decision modification. Where the syndrome of a current layer is non-zero, an odd number of hard decision modifications is needed to make the current syndrome value zero and increase the size of the CZS list. In some embodiments, there is a budget of allowable number of hard decision modifications per layer and another budget of an overall number of hard decision modifications that are allowed for the combined layers. Limiting the number of allowable hard decision modifications reduces the possibility of increased mis-correction probability. Following flow diagram 700, it is determined whether the next iteration is an initial local iteration of the layered data decode algorithm (block 705). Where it is the initial iteration of the layered decode algorithm (block 705), a layer counter (i) is set equal to zero and the CZS List is emptied (block 710).

A low density parity check decoding algorithm is applied to the layer of the decoder input indicated by the layer counter (i.e., the L[i] layer) (block 715). It is determined whether the processing during the low density parity check decoding resulted in a zero syndrome value (e.g., all parity check equations for the layer were resolved corrected)(block 720). Where the syndrome for the L[i] layer is not zero (i.e., an error remains in the layer) (block 720), it is determined whether the size of the CZS list exceeds an interim threshold (block 733). The interim size is a size sufficient to indicate that the currently processing codeword is close to convergence. As one example, the interim size may be a size within three of a full CZS list. Based upon the disclosure provided herein, one of ordinary skill in the art may recognize other sizes that may be used as the interim size in accordance with different embodiments of the present invention.

Where it is determined that the CZS list is not greater than the interim size (block 733), the CZS list is emptied (block 725). Alternatively, where it is determined that the CZS list is greater than the interim size (block 733), it is determined whether a limited, odd number of location value changes can be identified to make the syndrome equal to zero (i.e., can a limited, odd number of decision flips yield a syndrome of zero for the L[i] layer?)(block 743). In some embodiments of the present invention, the limited, odd number of location value changes is less than ten percent of the number of bits or symbols for a given layer. Where such value changes are not capable of yielding a value of zero for the syndrome (block 790), the CZS list is emptied (block 725). Alternatively, where such value changes are capable of yielding a value of zero for the syndrome (block 790), the value changes are made (block 753) and the process resumes at block 730.

Alternatively, where the syndrome for the L[i] layer is zero (e.g., all of the parity check equations resolve) (block 720), it is determined whether any of the hard decisions for the current layer are in conflict with any of the hard decisions from other layers identified in the CZS list (block 730). This is done by assuring that each hard decision in the current result (i.e., the hard decisions for the L[i] layer) is the same as each result from the other layers indicated in the CZS list for the same column position. Again, FIG. 9 shows an example parity check matrix 900 including rows 910a-910f that are processed as layers, and columns 920a-920p that are used to compare with other layers. Elements 0-49 indicate locations of hard decisions in parity check matrix. Using parity check matrix as an example and assuming the most recently processed layer corresponds to row 910c and the CZS list only includes hard decisions corresponding to row 910a (i.e., the L[i−2] layer and row 910b (i.e., the L[i−1]) layer, then checking to assure that the hard decision in the current result is the same as each result from the other layers indicated in the CZS list for the same column position includes: assuring that a hard decision 16 is the same as a hard decision 1 (i.e., there are no conflicts between the hard decisions in column 920c); assuring that a hard decision 17 is the same as a hard decision 9 (i.e., there are no conflicts between the hard decisions in column 920d); assuring that a hard decision 18 is the same as a hard decision 10 (i.e., there are no conflicts between the hard decisions in column 920e); assuring that a hard decision 20 is the same as a hard decision 3 (i.e., there are no conflicts between the hard decisions in column 920h); assuring that a hard decision 21 is the same as a hard decision 13 (i.e., there are no conflicts between the hard decisions in column 920j); and assuring that a hard decision 24 is the same as a hard decision 6 (i.e., there are no conflicts between the hard decisions in column 920p).

Where it is determined that the L[i] layer does not have any conflicts with any of the other layers in the CZS list (block 730), the L[i] layer is added to the CZS list (block 635). Thus, using the preceding example that refers to FIG. 9 where it is found that hard decision 16 is the same as a hard decision 1, hard decision 17 is the same as a hard decision 9, hard decision 18 is the same as a hard decision 10, hard decision 20 is the same as a hard decision 3, hard decision 21 is the same as a hard decision 13, and hard decision 24 is the same as a hard decision 6, then the CZS list is augmented to include the L[i] corresponding to row 910c in addition to the layers corresponding to rows 910a and 910b. It is then determined whether the CZS list has achieved its maximum list size (block 740). The maximum size of the CZS list is the number of layers in the parity matrix. Again, using parity matrix 900 of FIG. 9, the maximum size is six (i.e., the number of rows 910a-910f). Based upon the disclosure provided herein, one of ordinary skill in the art will recognize other numbers of layers that may be processed in accordance with different embodiments of the present invention. Where the CZS list is the maximum list size (block 740), then all of the errors have been corrected and the layered decode algorithm is considered to have converged which is indicated (block 745). Where such convergence is achieved, the process is returned to block 526 of FIG. 5B.

Alternatively, where it is determined that the L[i] layer does have conflicts with any of the other layers in the CZS list (block 730), the latest layer exhibiting a conflict with the L[i] layer is identified (block 750). Thus, using the preceding example that refers to FIG. 9, where the only conflict is that hard decision 16 is not the same as hard decision 1, then the latest layer exhibiting a conflict is the layer corresponding to row 910a. In addition, it is determined whether a limited, even number of decision flips can be identified to make the latest layer exhibiting a conflict farther in the past (i.e., can a limited, even number of decision flips increase the distance between the L[i] layer and the layer exhibiting a conflict?) (block 723). In the case of binary decoding, a decision flip is the change of a hard decision from one binary state to another binary state. In some embodiments of the present invention, the limited, even number of decision flips is less than ten percent of the number of hard decisions in a given layer. Based upon the disclosure provided herein, one of ordinary skill in the art will recognize other numbers that may be used in relation to different embodiments of the present invention. As an example, assume that the layer L[i−2] exhibits four conflicts with the layer L[i], that the number four is less than or equal to the limited, even number of decision flips, and that flipping the decisions in the Layer L[i−2] resolves all conflicts between the layer L[i] and the layer L[1−5], then the condition of block 793 would be met.

Where the condition of block 723 is met, the identified conflicting hard decisions are modified to resolve the conflict (block 727), and the processes of blocks 750, 723 are repeated for the new CZS list. Alternatively, where the condition of block 723 is not met, the CZS list is updated to include the most recent layer (i.e., the L[i] layer) and all other layers forming a continuous set of layers back to the latest layer exhibiting a conflict (block 755). Thus, using the previously discussed example where the next conflict is with the L[i−5] layer, then the CZS list is modified to include the L[i] layer, the L[i−1] layer, the L[i−2] layer, the L[i−3] layer and the L[i−4] layer.

It is then determined whether the layer counter (i) is a maximum value (block 760). The maximum value of the layer counter is the total number of layers less one. Where the layer counter is less than the maximum value (block 760), the layer counter is incremented (block 765) and the processes discussed above in relation to blocks 715-760 are repeated for the next layer indicated by the layer counter (i.e., the L[i+1] layer). Alternatively, where the layer counter is equal to the maximum value (block 760) indicating the completion of a local iteration of the data decoding algorithm, it is determined whether another local iteration is to be performed (block 770). Where another local iteration is desired (block 770), the layer counter (i) is reset to zero (block 780) and the processes discussed above in relation to blocks 715-760 is repeated for the initial layer corresponding to a layer counter value of zero (i.e., the L[0] layer). Alternatively, where no additional local iterations of the layered data decode algorithm are desired (block 770), then a failure to converge is indicated (block 775) and the process is returned to block 526 of FIG. 5B.

Figure 8:
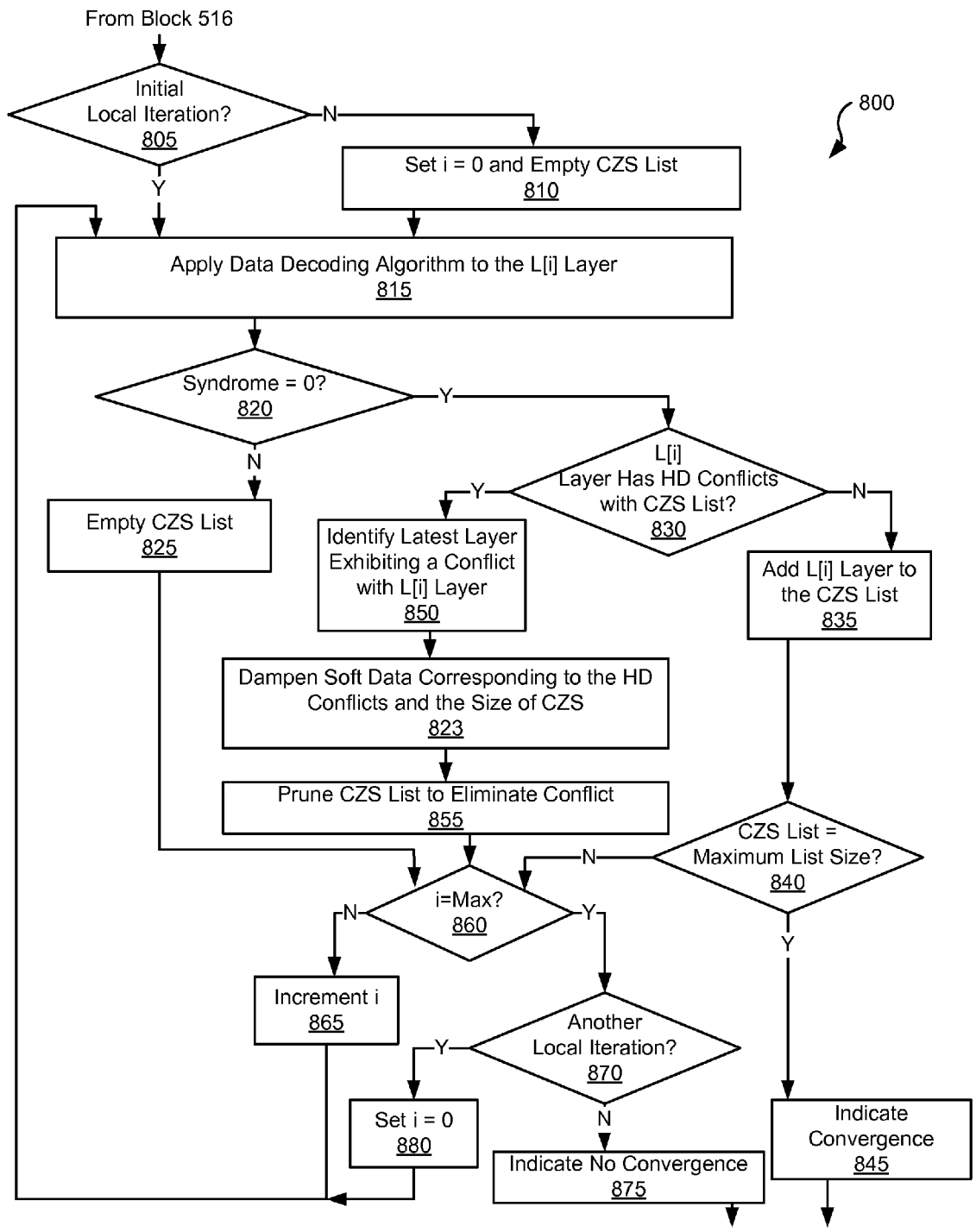

Turning to FIG. 8, another flow diagram 800 shows one implementation of applying the layered decode algorithm of block 521 is discussed in accordance with some embodiments of the present invention. This approach relies on a presumption that where hard decision conflicts are identified, it is an indication of weak confidence at that location. The approach reduces the soft data corresponding to locations where there is a hard decision conflict, thus causing the next local iteration and/or global iteration to make changes to that location. While not specifically disclosed herein, it should be noted that such soft data dampening may be combined with the hard decision modification approach of FIG. 7. In some cases, the soft data dampening may be implemented by multiplying the soft data by a scalar value. In some cases, the scalar value is user programmable. A more aggressive dampening (i.e., use of a lower scalar value) may be used as convergence is closer. Said another way, the scalar may be varied as a function of the size of the CZS list. In one particular embodiment of the present invention, a larger CZS list indicates a closer convergence and thus a lower scalar value is selected compared with a smaller scalar value selected for a smaller CZS list. As one particular example, where the CZS list is less than three layers, a scalar value of 0.7 is used. Where the CZS list grows to five layers, a scalar value of 0.5 is used. Where the CZS list grows to seven layers, a scalar value of 0.3 is used. Based upon the disclosure provided herein, one of ordinary skill in the art will recognize other scalar values that may be used as a function of the size of the CZS list. Alternatively, the scalar value may be selected as a function of how often a particular hard decision has been modified. A large number of modifications indicating a weaker confidence, and thus a lower scalar value. Following flow diagram 800, it is determined whether the next iteration is an initial local iteration of the layered data decode algorithm (block 805). Where it is the initial iteration of the layered decode algorithm (block 805), a layer counter (i) is set equal to zero and the CZS List is emptied (block 810).

A low density parity check decoding algorithm is applied to the layer of the decoder input indicated by the layer counter (i.e., the L[i] layer) (block 815). It is determined whether the processing during the low density parity check decoding resulted in a zero syndrome value (e.g., all parity check equations for the layer were resolved corrected)(block 820). Where the syndrome for the L[i] layer is not zero (i.e., an error remains in the layer) (block 820), the CZS list is emptied (block 825).

Alternatively, where the syndrome for the L[i] layer is zero (e.g., all of the parity check equations resolve) (block 820), it is determined whether any of the hard decisions for the current layer are in conflict with any of the hard decisions from other layers identified in the CZS list (block 830). This is done by assuring that each hard decision in the current result (i.e., the hard decisions for the L[i] layer) is the same as each result from the other layers indicated in the CZS list for the same column position. Again, FIG. 9 shows an example parity check matrix 900 including rows 910a-910f that are processed as layers, and columns 920a-920p that are used to compare with other layers. Elements 0-49 indicate locations of hard decisions in parity check matrix. Using parity check matrix as an example and assuming the most recently processed layer corresponds to row 910c and the CZS list only includes hard decisions corresponding to row 910a (i.e., the L[i−2] layer and row 910b (i.e., the L[i−1]) layer, then checking to assure that the hard decision in the current result is the same as each result from the other layers indicated in the CZS list for the same column position includes: assuring that a hard decision 16 is the same as a hard decision 1 (i.e., there are no conflicts between the hard decisions in column 920c); assuring that a hard decision 17 is the same as a hard decision 9 (i.e., there are no conflicts between the hard decisions in column 920d); assuring that a hard decision 18 is the same as a hard decision 10 (i.e., there are no conflicts between the hard decisions in column 920e); assuring that a hard decision 20 is the same as a hard decision 3 (i.e., there are no conflicts between the hard decisions in column 920*h*); assuring that a hard decision 21 is the same as a hard decision 13 (i.e., there are no conflicts between the hard decisions in column 920*j*); and assuring that a hard decision 24 is the same as a hard decision 6 (i.e., there are no conflicts between the hard decisions in column 920*p*).

Where it is determined that the L[i] layer does not have any conflicts with any of the other layers in the CZS list (block 830), the L[i] layer is added to the CZS list (block 835). Thus, using the preceding example that refers to FIG. 9 where it is found that hard decision 16 is the same as a hard decision 1, hard decision 17 is the same as a hard decision 9, hard decision 18 is the same as a hard decision 10, hard decision 20 is the same as a hard decision 3, hard decision 21 is the same as a hard decision 13, and hard decision 24 is the same as a hard decision 6, then the CZS list is augmented to include the L[i] corresponding to row 910*c* in addition to the layers corresponding to rows 910*a* and 910*b*. It is then determined whether the CZS list has achieved its maximum list size (block 840). The maximum size of the CZS list is the number of layers in the parity matrix. Again, using parity matrix 900 of FIG. 9, the maximum size is six (i.e., the number of rows 910*a*-910*f*). Where the CZS list is the maximum list size (block 840), then all of the errors have been corrected and the layered decode algorithm is considered to have converged which is indicated (block 845). Where such convergence is achieved, the process is returned to block 526 of FIG. 5B.

Alternatively, where it is determined that the L[i] layer does have conflicts with any of the other layers in the CZS list (block 830), the latest layer exhibiting a conflict with the L[i] layer is identified (block 850). Thus, using the preceding example that refers to FIG. 9, where the only conflict is that hard decision 16 is not the same as hard decision 1, then the latest layer exhibiting a conflict is the layer corresponding to row 910*a*. Further, soft decision data corresponding to the locations of the hard decision conflicts are dampened (block 823). Again, this may be done, for example, by multiplying the LLR data corresponding to the conflicted hard decision by a scalar value. The scalar value may be a fixed scalar value that may be, for example, user programmable. Alternatively, the scalar value may vary as a function of either the size of the CZS list or as a function of the number of hard decision modifications that have been made at the particular position. The CZS list is updated to include the most recent layer (i.e., the L[i] layer) and all other layers forming a continuous set of layers back to the latest layer exhibiting a conflict (block 855). Thus, using the preceding example that refers to FIG. 9 and assuming the L[i] layer corresponds to row 910*c* and the latest layer exhibiting a conflict is the L[i-2] layer corresponding to row 910*a*, then the CZS list is modified to include the L[i] layer corresponding to row 910*c* and the L[i-1] layer corresponding to row 910*b*.

It is then determined whether the layer counter (i) is a maximum value (block 860). The maximum value of the layer counter is the total number of layers less one. Thus, using parity check matrix 900 as an example, the maximum value of the layer counter is six (i.e., the number of rows 910*a*-910*f*). Again, based upon the disclosure provided herein, one of ordinary skill in the art will recognize other numbers of layers that may be processed in accordance with different embodiments of the present invention. Where the layer counter is less than the maximum value (block 860), the layer counter is incremented (block 865) and the processes discussed above in relation to blocks 815-860 is repeated for the next layer indicated by the layer counter (i.e., the L[i+1] layer).

Alternatively, where the layer counter is equal to the maximum value (block 860) indicating the completion of a local iteration of the data decoding algorithm, it is determined whether another local iteration is to be performed (block 870). In some cases, ten local iterations are allowed per each global iteration. Based upon the disclosure provided herein, one of ordinary skill in the art will recognize another number of local iterations that may be used in relation to different embodiments of the present invention. Where another local iteration is desired (block 870), the layer counter (i) is reset to zero (block 880) and the processes discussed above in relation to blocks 815-860 are repeated for the initial layer corresponding to a layer counter value of zero (i.e., the L[0] layer). Alternatively, where no additional local iterations of the layered data decode algorithm are desired (block 870), then a failure to converge is indicated (block 875) and the process is returned to block 526 of FIG. 5B.

Returning to FIG. 5B, it is determined whether the layered decode algorithm converged (i.e., resulted in the originally written data) (block 526). Where the layered decode algorithm converged (block 526), the resulting decoded output is provided as an output codeword (block 531). Alternatively, where the layered decode algorithm failed to converge (block 526), it is determined whether another global iteration is desired (block 556). Where another global iteration is desired (block 556), a derivative of the decoded output is stored to the central memory to await reprocessing using the data detection algorithm as discussed in relation to FIG. 5A (block 546). Alternatively, where another global iteration is not desired (block 556), the failure to converge is indicated as an error (block 562).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   a layered decoder circuit operable to apply a data decode algorithm to a first layer of a decoder input to yield a first set of hard decision data and a first syndrome, and to a second layer of a decoder input to yield a second set of hard decision data and a second syndrome;
   a data perturbation circuit operable to maintain a list of continuous layers exhibiting a zero value syndrome, wherein the list of continuous layers exhibiting a zero value syndrome includes hard decision data for each layer in the list.

2. The system of claim 1, wherein the data perturbation circuit is further operable to:
empty the list of continuous layers exhibiting a zero value syndrome when the second syndrome is non-zero.

3. The system of claim 1, wherein the list of continuous layers exhibiting a zero value includes the first set of hard decision data, the data perturbation circuit is further operable to:
compare the second set of hard decision data with corresponding elements in the first set of hard decision data to yield a set of conflicts, wherein the set of conflicts indicates locations where the second set of hard decision data does not agree with a corresponding element in the first set of hard decision data.

4. The system of claim 3, wherein the data perturbation circuit is further operable to:
dampen a soft decision corresponding to an element of the second hard decision data at a location in the set of conflicts.

5. The system of claim 4, wherein the data perturbation circuit includes a multiplier circuit, and wherein dampening the soft decision corresponding to the element of the second hard decision data at the location in the set of conflicts includes multiplying the soft decision by a scalar value.

6. The system of claim 5, wherein the scalar value is user programmable.

7. The system of claim 5, wherein the scalar value varies as a function of the number of layers represented in the list of continuous layers exhibiting a zero value syndrome.

8. The system of claim 1, wherein the data perturbation circuit is further operable to:
augment the list of continuous layers exhibiting a zero value syndrome to include the second set of hard decision data when the second syndrome is non-zero.

9. The system of claim 1, wherein the data perturbation circuit is further operable to:
determine that the second syndrome is non-zero; and
perform at least one decision flip in the second set of hard decision data to yield a zero value for the second syndrome and an updated set of hard decision data.

10. The system of claim 9, wherein the data perturbation circuit is further operable to:
augment the list of continuous layers exhibiting a zero value syndrome to include the updated set of hard decision data.

11. The system of claim 1, wherein the data decode algorithm is a low density parity check algorithm.

12. The system of claim 1, wherein the system is implemented as part of a device selected from a group consisting of: a communication device, and a storage device.

13. The system of claim 1, wherein the system is implemented as part of an integrated circuit.

14. A method for data processing, the method comprising:
applying a data decode algorithm by a data decoder circuit to a first layer of a decoder input to yield a first set of hard decision data and a first syndrome, and to a second layer of a decoder input to yield a second set of hard decision data and a second syndrome; and
maintaining a list of continuous layers exhibiting a zero value syndrome, wherein the list of continuous layers exhibiting a zero value syndrome includes at least the first set of hard decision data.

15. The method of claim 14, the method further comprising:
emptying the list of continuous layers exhibiting a zero value syndrome when the second syndrome is non-zero.

16. The method of claim 14, wherein the list of continuous layers exhibiting a zero value includes the first set of hard decision data, the method further comprising:
comparing the second set of hard decision data with corresponding elements in the first set of hard decision data to yield a set of conflicts, wherein the set of conflicts indicates locations where the second set of hard decision data does not agree with a corresponding element in the first set of hard decision data.

17. The method of claim 16, the method further comprising:
dampening a soft decision corresponding to an element of the second hard decision data at a location in the set of conflicts.

18. The method of claim 14, the method further comprising:
augmenting the list of continuous layers exhibiting a zero value syndrome to include the second set of hard decision data when the second syndrome is non-zero.

19. The method of claim 14, the method further comprising:
determining that the second syndrome is non-zero; and
performing at least one decision flip in the second set of hard decision data to yield a zero value for the second syndrome and an updated set of hard decision data.

20. A storage device, the storage device comprising:
a storage medium;
a data access circuit operable to access information from the storage medium as a processing input;
a data processing circuit including:
a layered decoder circuit operable to apply a data decode algorithm to a first layer of a decoder input to yield a first set of hard decision data and a first syndrome, and to a second layer of a decoder input to yield a second set of hard decision data and a second syndrome, wherein the decoder input is derived from the processing input;
a data perturbation circuit operable to maintain a list of continuous layers exhibiting a zero value syndrome, wherein the list of continuous layers exhibiting a zero value syndrome includes at least the first set of hard decision data.

* * * * *